(12) United States Patent
Lei

(10) Patent No.: US 6,846,360 B2
(45) Date of Patent: Jan. 25, 2005

(54) APPARATUS AND METHOD FOR BUBBLE-FREE APPLICATION OF A RESIN TO A SUBSTRATE

(75) Inventor: Dino Lei, San Jose, CA (US)

(73) Assignee: Aptos Corporation, Milpitas, CA (US)

( * ) Notice: Subject to any disclaimer, the term of this patent is extended or adjusted under 35 U.S.C. 154(b) by 0 days.

(21) Appl. No.: 10/341,993

(22) Filed: Jan. 13, 2003

(65) Prior Publication Data

US 2004/0134420 A1 Jul. 15, 2004

(51) Int. Cl.⁷ .................................................. B05C 5/02
(52) U.S. Cl. ........................... 118/50; 118/52; 118/319; 118/320
(58) Field of Search ............................. 118/50, 715, 52, 118/56, 319, 320; 156/345.1; 427/240

(56) References Cited

U.S. PATENT DOCUMENTS

| 4,990,208 | A | * | 2/1991 | Kano | ....................... 156/275.3 |
| 6,063,190 | A | * | 5/2000 | Hasebe et al. | ................ 118/52 |
| 6,627,038 | B2 | * | 9/2003 | Nakahara | ............... 156/345.29 |

* cited by examiner

*Primary Examiner*—Laura Edwards
(74) *Attorney, Agent, or Firm*—Tung & Associates

(57) ABSTRACT

An apparatus and method which is suitable for the bubble-free application of a resin to a substrate. The apparatus typically includes an airtight chamber which receives the substrate and a resin dispenser for dispensing the liquid resin onto the substrate. After a vacuum pressure is induced in the chamber, the resin is dispensed onto the substrate. Accordingly, air is substantially incapable of becoming trapped between the resin and the substrate and forming air bubbles during subsequent processing of the substrate.

12 Claims, 1 Drawing Sheet

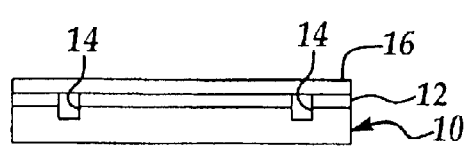

*Figure 1*
*Prior Art*

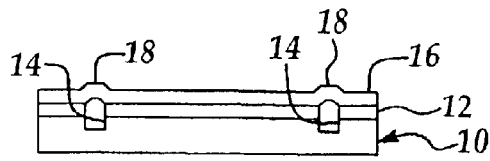

*Figure 2*
*Prior Art*

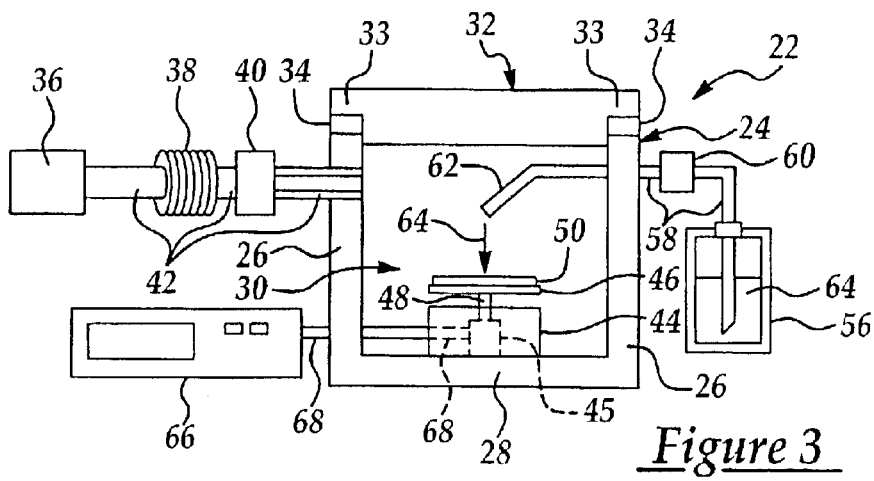

*Figure 3*

```
┌─────────────────────────────────┐
│ PUMPING DOWN COATING CHAMBER    │
│ PRESSURE (E.G. 60 TORR) (WAFER IN)│
└─────────────────────────────────┘
              │
              ▼
┌─────────────────────────────────┐
│ DISPENSE PHOTORESIST ON THE     │
│ CENTER OF WAFER (E.G. 10ml)     │
└─────────────────────────────────┘
              │
              ▼
┌─────────────────────────────────┐
│ START TO SPIN THE CHUCK         │
│ (E.G. 300RPM)                   │
└─────────────────────────────────┘
              │
              ▼
┌─────────────────────────────────┐
│ FINAL SPEED TO GET 30um PR      │
│ (E.G. 550RPM)                   │
└─────────────────────────────────┘
              │
              ▼
┌─────────────────────────────────┐
│ STOP ROTATING                   │
└─────────────────────────────────┘
              │
              ▼
┌─────────────────────────────────┐
│ BACK FILL CHAMBER TO ATMOSPHERE │
└─────────────────────────────────┘
```

*Figure 4*

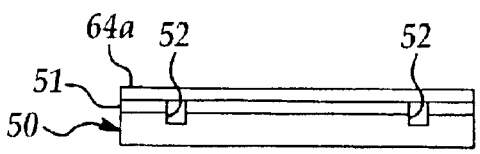

*Figure 5*

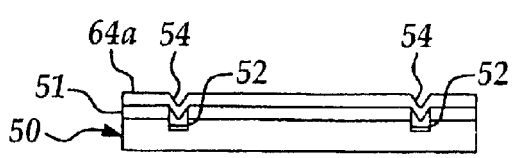

*Figure 6*

APPARATUS AND METHOD FOR BUBBLE-FREE APPLICATION OF A RESIN TO A SUBSTRATE

FIELD OF THE INVENTION

The present invention relates to photolithography processes used in the formation of integrated circuit (IC) patterns on photoresist in the fabrication of semiconductor integrated circuits. More particularly, the present invention relates to an apparatus and method for application of a resin such as a photoresist onto a substrate under vacuum pressure to prevent the formation of bubbles on the substrate during subsequent substrate processing under elevated temperatures.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include spin-coating of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

Spin coating of photoresist on wafers, as well as the other steps in the photolithography process, is carried out in an automated coater/developer track system using wafer handling equipment which transport the wafers between the various photolithography operation stations, such as vapor prime resist spin coat, develop, baking and chilling stations. Robotic handling of the wafers minimizes particle generation and wafer damage. Automated wafer tracks enable various processing operations to be carried out simultaneously. Two types of automated track systems widely used in the industry are the TEL (Tokyo Electron Limited) track and the SVG (Silicon Valley Group) track.

Photoresist materials are coated onto the surface of a wafer by dispensing a photoresist fluid typically on the center of the wafer as the wafer rotates at high speeds within a stationary bowl or coater cup. The coater cup catches excess fluids and particles ejected from the rotating wafer during application of the photoresist. The photoresist fluid dispensed onto the center of the wafer is spread outwardly toward the edges of the wafer by surface tension generated by the centrifugal force of the rotating wafer. This facilitates uniform application of the liquid photoresist on the entire surface of the wafer.

After it is layered on the substrate, the photoresist is exposed to light through a mask or reticle in an alignment and exposure process. A reticle is a transparent plate patterned with a circuit image to be formed in the photoresist coating on the wafer. A reticle contains the circuit pattern image for only a few of the die on a wafer, such as four die, for example, and thus, must be stepped and repeated across the entire surface of the wafer. In contrast, a photomask, or mask, includes the circuit pattern image for all of the die on a wafer and requires only one exposure to transfer the circuit pattern image for all of the dies to the wafer. After alignment and exposure, the photoresist is developed.

The circuit pattern defined by the developed and hardened photoresist is next transferred to the underlying metal conductive layer using a metal etching process, in which metal over the entire surface of the wafer and not covered by the cross-linked photoresist is etched away from the wafer with the metal under the cross-linked photoresist that defines the circuit pattern protected from the etchant. As a result, a well-defined pattern of metallic microelectronic circuits which closely approximates the cross-linked photoresist circuit pattern remains in the metal layer.

The numerous processing steps outlined above are used to cumulatively apply multiple electrically conductive and insulative layers on the wafer and pattern the layers to form the circuits. The final yield of functional circuits on the wafer depends on proper application of each layer during the process steps. Proper application of those layers depends, in turn, on coating the material in a uniform spread over the surface of the wafer in an economical and efficient manner.

A typical method of forming a circuit pattern on a wafer includes introducing the wafer into the automated track system and then spin-coating a photoresist layer onto the wafer. The photoresist is next cured by conducting a soft bake process. After it is cooled, the wafer is placed in an exposure apparatus, such as a stepper, which aligns the wafer with an array of die patterns etched on the typically chrome-coated quartz reticle. When properly aligned and focused, the stepper exposes a small area of the wafer, then shifts or "steps" to the next field and repeats the process until the entire wafer surface has been exposed to the die patterns on the reticle. The photoresist is exposed to light through the reticle in the circuit image pattern. Exposure of the photoresist to this image pattern cross-links and hardens the resist in the circuit pattern. After the aligning and exposing step, the wafer is exposed to post-exposure baking and then is developed and hard-baked to develop the photoresist pattern.

A substrate 10 having a conductive layer 12 deposited thereon is shown in FIG. 1. Frequently, one or multiple pin holes 14 extends through the conductive layer 12 into the wafer 10 for various purposes such as testing or proper alignment of the wafer 10 prior to processing, for example. A layer of photoresist 16 is deposited on the conductive layer 12 and then is typically subjected to a soft-bake curing step. Next, the photoresist 16 is subjected to an alignment and exposure step in which the photoresist 16 is exposed to light through a reticle or mask (not shown) to superimpose the circuit pattern in the reticle or mask onto the photoresist 16 by cross-linking the photoresist 16 along the areas of light exposure. Finally, the underlying conductive layer 12 is etched around the etchant-resistant, cross-linked photoresist to form the desired circuit pattern in the conductive layer 12.

The photoresist-deposition step is typically carried out in a coater cup (not shown) which is open to atmospheric pressure in the semiconductor fabrication facility. Accordingly, in the coater cup the photoresist 16 is layered over the conductive layer 12 under atmospheric pressure and extends over the pin holes 14, as shown in FIG. 1. During this step, air becomes trapped in the pin holes 14. During the subsequent soft-bake step which is carried out to cure the photoresist 16, the heated air trapped in the pin holes 14 expands against the overlying photoresist 16, pushing the photoresist 16 upwardly and forming air bubbles 18 above the respective pin holes 14, as shown in FIG. 2. These air bubbles 18 interfere with subsequent processing of the substrate 10, particularly the alignment and exposure process which is carried out after the soft bake curing step to superimpose the circuit pattern image from the mask or reticle onto the photoresist 16. Accordingly, an apparatus and method is needed for carrying out the photoresist-coating step in such a manner as to eliminate the formation of air bubbles in the photoresist during the soft bake photoresist-curing step.

An object of the present invention is to provide an apparatus and method for the bubble-free application of a resin to a substrate.

Another object of the present invention is to provide an apparatus and method which is suitably adapted for applying a photoresist to a wafer in such a manner as to eliminate the formation of air pockets in the wafer beneath the photoresist.

Still another object of the present invention is to provide an apparatus and method which is suitable for preventing the formation of air bubbles in or beneath a layer of photoresist during a soft-bake curing step of photolithography.

Yet another object of the present invention is to provide an apparatus and method which may have application to various industries in the bubble-free application of a resin to a substrate.

A still further object of the present invention is to provide a method for the bubble-free application of a resin to a substrate, which method includes applying the resin to the substrate under vacuum pressure.

Yet another object of the present invention is to provide an apparatus which is suitable for the bubble-free application of a resin to a substrate, which apparatus includes an airtight chamber for receiving the substrate and a resin supply dispenser for dispensing the resin onto the substrate.

SUMMARY OF THE INVENTION

In accordance with these and other objects and advantages, the present invention is generally directed to an apparatus and method which is suitable for the bubble-free application of a resin to a substrate. The apparatus typically includes an airtight chamber which receives the substrate and a resin dispenser for dispensing the liquid resin onto the substrate. After a vacuum pressure is induced in the chamber, the resin is dispensed onto the substrate. Accordingly, air is substantially incapable of becoming trapped between the resin and the substrate and forming air bubbles during subsequent processing of the substrate.

BRIEF DESCRIPTION OF THE DRAWINGS

The invention will now be described, by way of example, with reference to the accompanying drawing, in which:

FIG. 1 is a cross-sectional view of a substrate and a photoresist layer dispensed onto the substrate according to a conventional photoresist-dispensing method;

FIG. 2 is a cross-sectional view of the substrate of FIG. 1, after the photoresist-coated substrate is subjected to a soft-baking step, more particularly illustrating the formation of air bubbles beneath the photoresist;

FIG. 3 is a side view, partially in cross-section, of an apparatus according to the present invention;

FIG. 4 is a flow diagram illustrating a typical process flow according to the method of the present invention;

FIG. 5 is a cross-sectional view of a substrate and a photoresist layer dispensed onto the substrate in implementation of the apparatus and method of the present invention; and FIG. 6 is a cross-sectional view of the substrate and photoresist layer of FIG. 5, after atmospheric pressure is restored to the apparatus in implementation of the apparatus and method of the present invention.

DESCRIPTION OF THE PREFERRED EMBODIMENTS

The present invention has particularly beneficial utility in the bubble-free application of photoresist to a substrate during the course of fabricating IC (integrated circuit) devices on the substrate. However, the invention is not so limited in application, and while references may be made to such photoresist and integrated circuits, the invention is more generally suitable for the bubble-free application of any type of liquid resin to a substrate in a variety of industrial and mechanical applications.

Referring initially to FIG. 3, an illustrative embodiment of the apparatus 22 in accordance with the present invention includes a vacuum chamber 24, having a chamber wall 26 and a chamber bottom 28 which define a chamber interior 30. A chamber lid 32, having a lid flange 33, removably and sealingly engages the vacuum chamber 24. An o-ring 34 provided on the upper edge of the chamber wall 26 or on the lower surface of the lid flange 33 is sandwiched between the upper edge of the chamber wall 26 and the lid flange 33 when the chamber lid 32 is seated on the vacuum chamber 24, as shown, to provide an airtight seal between the chamber interior 30 and the exterior of the vacuum chamber 24. A substrate spinner 44 is provided on the chamber bottom 28, in the chamber interior 30. The substrate spinner 44 contains a spinner motor 45 which rotatably engages the lower end of a shaft 48 that extends upwardly from the spinner 44. A substrate support 46 provided on the upper end of the shaft 48 is adapted for holding a substrate 50, as hereinafter further described. A speed controller 66 operably engages the spinner motor 45 through a controller shaft 68 which extends through the chamber wall 26 and into the spinner 44. Accordingly, the spinner motor 45 is operable to rotate the shaft 48 and the substrate support 46. The operational speed of the spinner motor 45 is controlled by operation of the speed controller 66, according to the knowledge of those skilled in the art.

A vacuum conduit 42 is disposed in fluid communication with the chamber interior 30 and may extend through the chamber wall 26, as shown. A vacuum pump 36 is provided in fluid communication with the vacuum conduit 42. A bellow 38 is provided in the vacuum conduit 42 adjacent to the vacuum pump 36, and a throttle valve 40 is provided in the vacuum conduit 42 between the bellow 38 and the chamber wall 26. Accordingly, when the chamber lid 32 sealingly engages the chamber wall 26, the vacuum pump 36 is operable to partially evacuate air from the chamber interior 30 and through the throttle valve 40 and bellow 38, respectively, to provide a partial vacuum pressure inside the chamber interior 30 for purposes which will be hereinafter described.

A photoresist container 56, which contains a supply of liquid photoresist 64, is disposed in fluid communication with the chamber interior 30 through a photoresist delivery conduit 58, which typically extends through the chamber wall 26. A valve 60 is typically provided in the photoresist delivery conduit 58. A photoresist dispensing spout 62, disposed above the substrate support 46 inside the chamber interior 30, is provided in fluid communication with the photoresist delivery conduit 58. The interior of the photoresist container 56 may be provided in pneumatic communication with the exterior of the photoresist container 56 to establish atmospheric air pressure inside the photoresist container 56. Accordingly, responsive to vacuum pressure induced in the chamber interior 30 by operation of the vacuum pump 36, as hereinafter described, the liquid photoresist 64 is drawn from the photoresist container 56, through the photoresist delivery conduit 58 and the valve 60, and is dispensed from the photoresist dispensing spout 62 onto the substrate 50. The valve 60 regulates flow of the liquid photoresist 64 from the photoresist container 56, through the photoresist delivery conduit 58 and photoresist dispensing spout 62, respectively, and onto the rotating substrate 50. Alternatively, it is understood that any suitable pumping mechanism (not shown) known by those skilled in the art may be operably connected to the photoresist delivery conduit 58 for measured pumping of the liquid photoresist 64 from the photoresist container 56 and onto the substrate 46.

Referring next to FIGS. 3–6, in typical operation of the apparatus 22 according to the method of the present invention, a photoresist layer 64a is deposited under partial vacuum pressure on a conductive layer 51 previously formed on a substrate 50. Deposit of the photoresist layer 64a on the substrate 50 under partial-vacuum conditions prevents the trapping of air in pin holes 52 formed in the substrate 50 and formation of air bubbles (not shown) in the photoresist layer 64a during the subsequent soft baking step of photolithography. Accordingly, the substrate 50, having had the conductive layer 51 previously deposited thereon, is initially placed on the substrate support 46 in the chamber interior 30 of the vacuum chamber 24. After the chamber lid 32 is placed on the vacuum chamber 24 to provide an airtight seal between the chamber interior 30 and the outside of the vacuum chamber 24, the vacuum pump 36 is operated to draw air from the chamber interior 30 through the vacuum conduit 42, the throttle valve 40 and the bellow 38, respectively, until the partial vacuum pressure inside the chamber interior 30 reaches the desired level, typically about 60 torr.

Next, the valve 60 is opened to allow flow of a selected quantity of liquid photoresist 64 from the photoresist container 56, through the photoresist delivery conduit 58 and onto the conducting layer 51 (FIG. 5) at the center of the substrate 50, respectively, as atmospheric air pressure in the photoresist container 56 pushes the liquid photoresist 64 from the photoresist container 56 and onto the substrate 50. Typically, about 10 ml of the liquid photoresist 64 is dispensed onto the center of the substrate 50. However, it is understood that the quantity of liquid photoresist 64 dispensed onto the substrate 50 may vary depending on the application. After the desired quantity of liquid photoresist 64 is dispensed onto the substrate 50, the valve 60 is closed to prevent further flow of the liquid photoresist 64 from the photoresist container 56 and onto the substrate 50.

The substrate support 46 and substrate 50 are next rotated by operation of the spinner motor 45, initially at a typical speed of about 300 rpm. Accordingly, centrifugal force imparted by the rotating substrate 50 pulls the liquid photoresist 64 from the center toward the edge of the substrate 50 to provide a substantially uniform spread of the liquid photoresist 64 on the conductive layer 51. By operation of the speed controller 66, the rotational speed of the substrate support 46 is gradually increased to about 550 rpm in order to obtain a final thickness of the photoresist layer 64a of typically about 30 $\mu$m. At that point, rotation of the substrate support 46 is terminated and the photoresist layer 64a extends over the pin holes 52 in the substrate 50, as shown in FIG. 5.

Finally, atmospheric pressure in the chamber interior 30 is re-established by releasing vacuum pressure induced therein by the vacuum pump 36. Because the air pressure in each of the pin holes 52 equals the partial vacuum pressure induced in the chamber interior 30 during application of the photoresist layer 64a, the re-established atmospheric pressure in the chamber interior 30 pushes the hole-spanning segments of the pliant photoresist layer 64a into the respective pin holes 52, causing depressions 54 at the respective pin holes 52, as shown in FIG. 6. Next, the substrate 50 is removed from the chamber interior 30 and subjected to a soft bake process at a downstream processing tool (not shown) to cure the photoresist layer 64a, after which the substrate 50 is subjected to an alignment and exposure step in which a circuit pattern is superimposed on the photoresist layer 64a through a mask or reticle (not shown). Accordingly, air bubbles which otherwise would have formed in the photoresist layer 64a at the pin holes 52 during the soft bake curing step are not present to interfere with the alignment and exposure step prior to etching of the circuit pattern in the underlying conductive layer 51. After the metal etching process, the substrate 50 is typically subjected to a plasma ashing and wet stripping process, in conventional fashion, to remove the residual photoresist 64a from the substrate 50, leaving the circuit pattern in the conductive layer 51.

While the preferred embodiments of the invention have been described above, it will be recognized and understood that various modifications can be made in the invention and the appended claims are intended to cover all such modifications which may fall within the spirit and scope of the invention.

What is claimed is:

1. An apparatus for bubble-free application of a resin to a substrate, comprising:
    a vacuum chamber for receiving the substrate;
    a vacuum pump provided in fluid communication with said vacuum chamber for inducing a vacuum pressure in said vacuum chamber;
    a bellow provided in fluid communication with said vacuum pump and a throttle valve provided in fluid communication with said bellow;
    a container for containing the resin provided in fluid communication with said vacuum chamber; and
    a dispensing spout provided in fluid communication with said container and said vacuum chamber for dispensing the resin onto the substrate.

2. The apparatus of claim 1 further comprising a substrate support provided in said vacuum chamber for supporting the substrate and a spinner motor operably engaging said substrate support for rotating said substrate support.

3. The apparatus of claim 1 further comprising a valve provided in said dispensing spout.

4. The apparatus of claim 3 further comprising a substrate support provided in said vacuum chamber for supporting the substrate and a spinner motor operably engaging said substrate support for rotating said substrate support.

5. The apparatus of claim 1 further comprising a vacuum conduit provided in fluid communication with said vacuum chamber and wherein said vacuum pump, said bellow and said throttle valve are provided in said vacuum conduit.

6. The apparatus of claim 5 further comprising a substrate support provided in said vacuum chamber for supporting the substrate and a spinner motor operably engaging said substrate support for rotating said substrate support.

7. The apparatus of claim 5 further comprising a valve provided in said dispensing spout.

8. The apparatus of claim 7 further comprising a substrate support provided in said vacuum chamber for supporting the substrate and a spinner motor operably engaging said substrate support for rotating said substrate support.

9. The apparatus of claim 2 further comprising a speed controller operably connected to said spinner motor for controlling an operational speed of said spinner motor.

10. The apparatus of claim 9 further comprising a valve provided in said dispensing spout.

11. The apparatus of claim 9 further comprising a vacuum conduit provided in fluid communication with said vacuum chamber and wherein said vacuum pump, said bellow and said throttle valve are provided in said vacuum conduit.

12. The apparatus of claim 11 further comprising a valve provided in said dispensing spout.

* * * * *